United States Patent [19]

Bormann

[11] 4,019,068
[45] Apr. 19, 1977

[54] LOW POWER OUTPUT DISABLE CIRCUIT FOR RANDOM ACCESS MEMORY

[75] Inventor: Alan Richard Bormann, Tempe, Ariz.

[73] Assignee: Motorola, Inc., Chicago, Ill.

[22] Filed: Sept. 2, 1975

[21] Appl. No.: 609,457

[52] U.S. Cl. .............................. 307/205; 307/209; 307/279; 307/DIG. 4; 307/DIG. 5; 340/173 R

[51] Int. Cl.² ................ H03K 19/08; H03K 19/34; H03K 3/353; G11C 7/00

[58] Field of Search .......... 307/270, 304, 209, 238, 307/279, 205, DIG. 4, DIG. 5; 340/173 R, 173 AM

[56] References Cited

UNITED STATES PATENTS

| 3,697,775 | 10/1972 | Kane | 307/209 |
|---|---|---|---|
| 3,778,784 | 12/1973 | Karp et al. | 307/238 X |
| 3,859,637 | 1/1975 | Platt et al. | 340/173 CP X |
| 3,906,464 | 9/1975 | Lattin | 307/DIG. 5 X |

*Primary Examiner*—John S. Heyman
*Assistant Examiner*—Larry N. Anagnos
*Attorney, Agent, or Firm*—Charles R. Hoffman

[57] ABSTRACT

An output circuit including a latch circuit and a push-pull output driver driven by the latch circuit is controlled by disable circuit which disables the output circuit when a random access memory semiconductor chip on which the output circuit is located undergoes an unselected memory cycle, i.e., is unselected. The disable circuit includes a bootstrap NOR gate having a series power switching IGFET coupling its load device to a voltage supply conductor. The power switching IGFET is controlled by the output of the disable circuit so that the disable circuit shuts off its own power at the same time it disables the output latch when the random access memory chip undergoes an unselected memory cycle. Essentially, the disable circuit operates in such a manner that it shuts off its own power and also disables the output circuit in response to a second input signal, conditioned on the occurrence of an earlier first signal.

3 Claims, 3 Drawing Figures

LOW POWER OUTPUT DISABLE CIRCUIT FOR RANDOM ACCESS MEMORY

BACKGROUND OF THE INVENTION

1. Field of the Invention

The invention relates to electronic semiconductor circuits, and more particularly to circuits which reduce power dissipation and semiconductor random access memory chips.

2. Description of the Prior Art.

MOSFETs (also called IGFETS) have been widely utilized, especially in integrated circuit form, to implement random access memories and other complex logic functions.

Power dissipation is frequently a problem in IGFET integrated circuit semiconductor chips because powder dissipation in such a chip raises the operating temperature, which may effect reliability of the MOSFETs on the chip. In MOS RAM (random access memory) integrated circuits, especially in dynamic RAMs, the main areas of power dissipation are in the column decode circuitry, row decode circuitry, sensing circuits, and input/output circuits. In memory systems constructed from MOS RAM chips packaged in conventional packages, a fairly large number of chips have their data output conductors coupled to a common data bus. However, only one chip at a time, referred to as the selected chip, can communicate with the common data bus. The remaining chips are said to be unselected. The chips incorporate circuitry which effectively electrically isolates their data output terminal from any low impedance to the respective semiconductor chip in response to a chip select input. The chip select input is frequently utilized to disable output and data input circuitry so that if the chip is unselected during a particular memory cycle, the data output driver has both its load MOSFET and its switch MOSFET turned off so that the data output conductor is essentially electrically floating, and so that the data input terminal is isolated from any storage cell during any memory cycle if the chip is unselected.

SUMMARY OF THE INVENTION

It is an object of the invention to provide an output circuit for a random access memory which reduces the power dissipation of a random access memory by interposing a high impedance between the power source and said output circuit when said memory chip undergoes an unselected cycle.

It is another object of the invention to provide a semiconductor circuit which produces an output signal in response to a certain combination of input signals thereto, which output signal acts upon said circuit to reduce current supplied to said circuit, thereby reducing its power dissipation.

Briefly described, the invention is an electronic circuit having an input stage having an input thereof, and also having an output stage driven by said input stage. The output stage generates an output signal which is fed back by means of a voltage conductor to the input stage and is connected to a control electrode of a switching device connected between the input stage and a supply voltage conductor. When a logical zero level appears on the output conductor, the switching device is turned off, thereby reducing current flow through the input stage and reducing power dissipation of the electronic circuit. In one embodiment of the invention, the electronic circuit is used as an output disable circuit for a random access memory. In this embodiment, when the random access memory undergoes an unselected memory cycle operation, the electronic circuit disables an output latch circuit of the random access memory, and essentially simultaneously cuts off power to itself, thereby reducing power dissipation of the random access memory for an unselected memory cycle.

DESCRIPTION OF THE INVENTION

Figure 1:
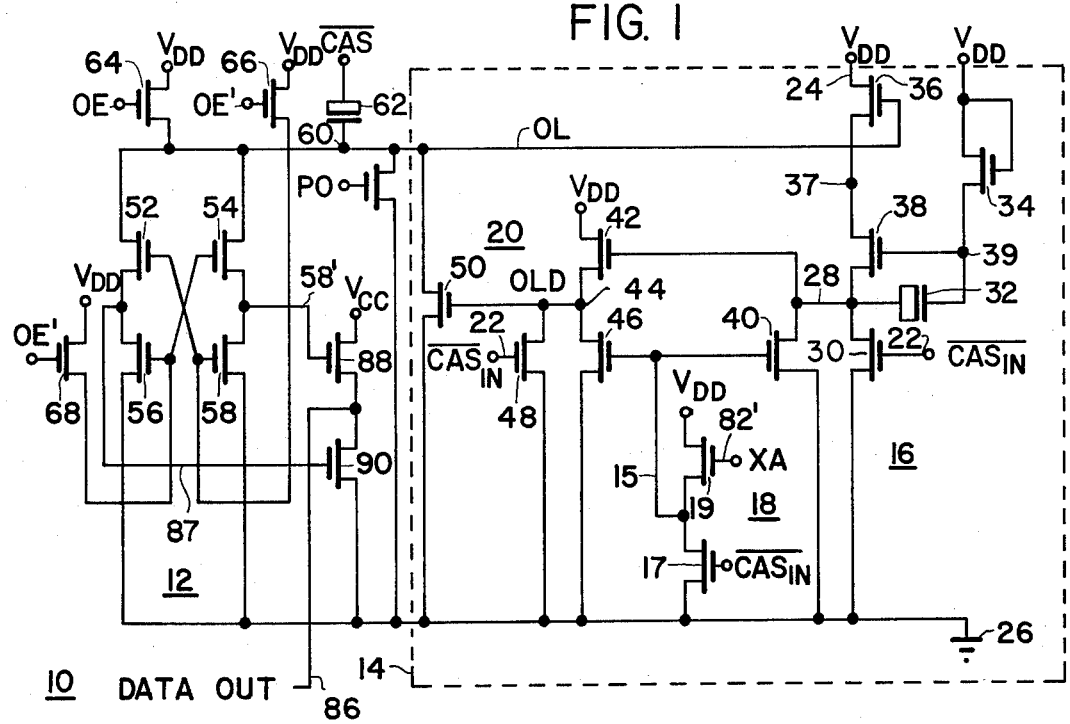
FIG. 1 is a schematic diagram of a preferred embodiment of the invention.
Figure 2:
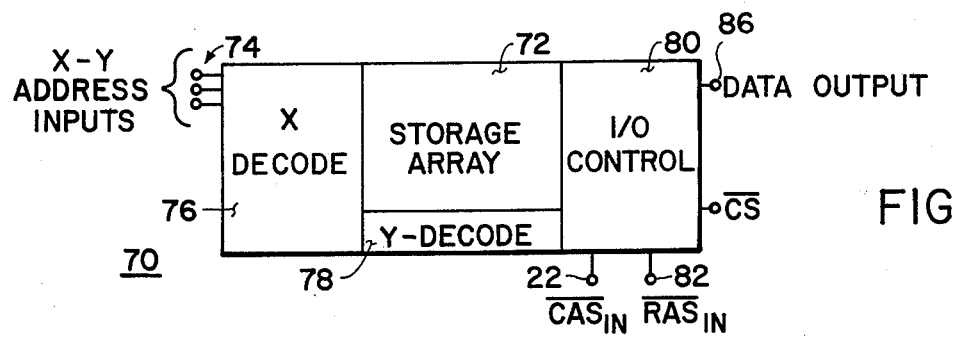
FIG. 2 is a block diagram of a random access memory chip in which the embodiment of FIG. 1 may be utilized.

FIG. 1 includes, in a presently preferred embodiment of the invention, circuit 10 which is a portion of the circuitry of a semiconductor integrated circuit random access memory 70, as shown in FIG. 2.

A block diagram of such a semiconductor random access memory chip 70 is shown in FIG. 2, which includes a storage array 72, X decode circuit 76 Y decode circuit 78, and input output and control circuitry 80. A particular memory location in storage array 72 is selected by means of address inputs applied to address input terminals 74. In one embodiment of the invention, a particular binary configuration of address inputs 74 is first multiplexed into corresponding input address latch circuit in X decode circuitry 76 in response to a control signal on $\overline{RAS}_{IN}$ conductor 82. After the later event is completed, a second address control input signal $\overline{CAS}_{IN}$, is applied to input conductor 22, and a new binary address input configuration on input conductors 74 is thereby multiplexed into the corresponding plurality of additional address input latch circuits in Y decode circuit 78. Data stored in the selected storage cell is sensed and amplified and routed through input-output circuitry 80 to provide an output data signal on data output conductor 86. In a typical system, a plurality of RAM chips, such as chip 70, are coupled to a common address input and a common data output conductor, and an additional chip select input disables all of the RAM chips except the selected chip, which communicates with the common data output conductor.

Referring again to FIG. 1, circuitry 10 includes output latch 12 and output disable circuit 14. Output disable circuit 14 includes a bootstrap NOR gate 16, NOR gate 20 and inverter 18. Bootstrap NOR gate 16 includes load MOSFET 38, coupling MOSFET 36, bootstrap charging MOSFET 34, bootstrap capacitor 32, and input MOSFETs 30 and 40. MOSFET 30 is connected between node 28 and ground conductor 26 and has its gate connected to $\overline{CAS}_{IN}$ conductor 22. Load MOSFET 38 has its gate connected to bootstrap node 39, its source connected to node 28 and its drain connected to node 37. Bootstrap capacitor 32 is connected between node 39 and node 28. Bootstrap charging MOSFET 34 is connected between $V_{DD}$ conductor 24 and node 39, and has its gate connected to $V_{DD}$. MOSFET 36 is connected between $V_{DD}$ conductor 24 and node 37 and has its gate connected to OL output conductor 60, and functions to electrically isolate the rest of bootstrap inverter circuit 16 from $V_{DD}$ conductor 24 under certain circumstances, described hereinafter, to reduce power dissipation of output circuit 10 when the random access memory chip 70 in which output circuit 10 is located is not selected, i.e., undergoes an unselected memory cycle. NOR gate 20 includes MOSFETs 42, 46, and 48. Load MOSFET 42 is connected between $V_{DD}$ conductor 24 and node 44, and has its gate connected to node 28. Switch MOSFET 46 is connected between node 44 and ground conductor 26 and has its gate connected to the gate of MOSFET 40, which is the other switch MOSFET of bootstrap NOR gate circuit 16 and is coupled between node 28 and ground conductor 26. MOSFET 48 is the other switching MOSFET of NOR gate 20 and is connected between node 44 and ground conductor 26 and has its gate electrode connected to $\overline{CAS}_{IN}$ input conductor 22. Node 44 drives the gate of MOSFET 50 which is the output MOSFET of output disable circuit 14 and is connected between OL output conductor 60 and ground conductor 26.

Inverter 18 includes load MOSFET 19 connected between $V_{DD}$ and node 15, which is also connected to the gate of MOSFETs 46 and 40. The gate of MOSFET 19 is connected to XA conductor 82'. Switch MOSFET 17 is connected between node 15 and ground conductor 26 and has its gate connected to $\overline{CAS}_{IN}$ conductor 22.

Output latch 12 includes a cross-coupled latch circuit including MOSFETs 52, 54, 56 and 58. MOSFETs 54 and 58 are coupled in series between ground conductor 26 and OL output conductor 60. Similarly, MOSFETs 52 and 56 are coupled in series between OL output conductor 60 and ground conductor 26. MOSFETs 52 and 54 have their drains connected to OL output conductor 60 and MOSFETs 56 and 58 have their sources connected to ground conductor 26.

Those skilled in the art will recognize that MOSFETs (metal oxide semiconductor field effect transistors), as implemented in typical integrated circuits, are bilateral devices, having a gate and a source and a drain. However, the source and drain are functionally interchangeable, and both in the description and in the claims herein, the terms are utilized merely to indicate interconnections, rather than function of a particular MOSFET terminal. For example, the terminal of MOSFET 34 which functions as a drain for one part of the circuit operation may function as a source for another part of the circuit operation. For a more complete description of the operation and physics of MOSFETs, see "Physics and Technology of Semiconductor Devices", by A.S. Grove, John Wiley & Sons, Inc., 1967. Those skilled in the art will also recognize that the acronym MOSFET is commonly used synonymously with the term IGFET (insulated gate field effect transistor), even though the gate may be polycrystalline silicon or some other conductive material rather than metal.

The gates of MOSFETS 52 and 58 are coupled together and to a source electrode of precharge MOSFET 66, which has its drain connected to $V_{DD}$ conductor 24 and its gate connected to OE'. Similarly, MOSFETs 54 and 56 have their gates connected together and to the source of MOSFET 68, which has its drain connected to $V_{DD}$ conductor 26 and its gate connected to OE'. The common junction between MOSFETs 54 and 58 is connected to the gate of MOSFET 88, which, in combination with MOSFET 90, forms an inverter which is coupled between $V_{CC}$ and ground conductor 26 and has conductor 96 as its data output conductor.

The junction common between MOSFETs 52 and 56 is connected to the gate of MOSFET 90.

The operation of the circuit of FIGS. 1 and 2 is described with reference to the timing diagram of FIG. 3.

The operation of the embodiment of FIG. 1 is described with reference to the waveforms of FIG. 3. FIG. 3 includes the waveforms of the input waveforms indicated in FIGS. 1 and 2 and also the waveforms of some of the important internal nodes of the schematic drawing of FIG. 1.

The main function of the circuit of FIG. 1 is to disable output latch 12 so that the data out signal on node 86 is effectively electrically open and also to cut off its own source of power under the condition that the memory chip 70 is subjected to a "nonselected" cycle. The waveform $\overline{RAS}_{IN}$ is the row address control input. When this input is activated by undergoing a negative transition as shown in FIG. 3 the RAM chip is said to be selected, for purposes of this discussion. An internal signal XA is derived from $\overline{RAS}_{In}$ and is utilized by circuitry in RAM 70 to strobe the X address inputs into the X address input buffers in X decode section 76. Next, the column address control input signal $\overline{CAS}_{IN}$ undergoes a negative transition which results in the address inputs being multiplexed into a plurality of Y input buffers in Y decode circuit 78. Sensing or reading into the selected cell at the intersection of the selected column in the selected row then occurs. However, for an unselected memory cycle, no negative transition of $\overline{RAS}_{IN}$ occurs. Instead, only a $\overline{CAS}_{In}$ negative transition occurs. This is illustrated in timing diagram of FIG. 3, where it is seen that the second $\overline{CAS}_{In}$ pulse is not coincident with a $\overline{RAS}_{IN}$ pulse. Under these conditions it is desirable, in a memory system having a plurality of RAM chips connected to the common data bus, to deselect or in effect, electrically isolate unselected RAM chips from the common data output bus. In a typical system, the $\overline{RAS}_{IN}$ address control input will be decoded.

Figure 3:
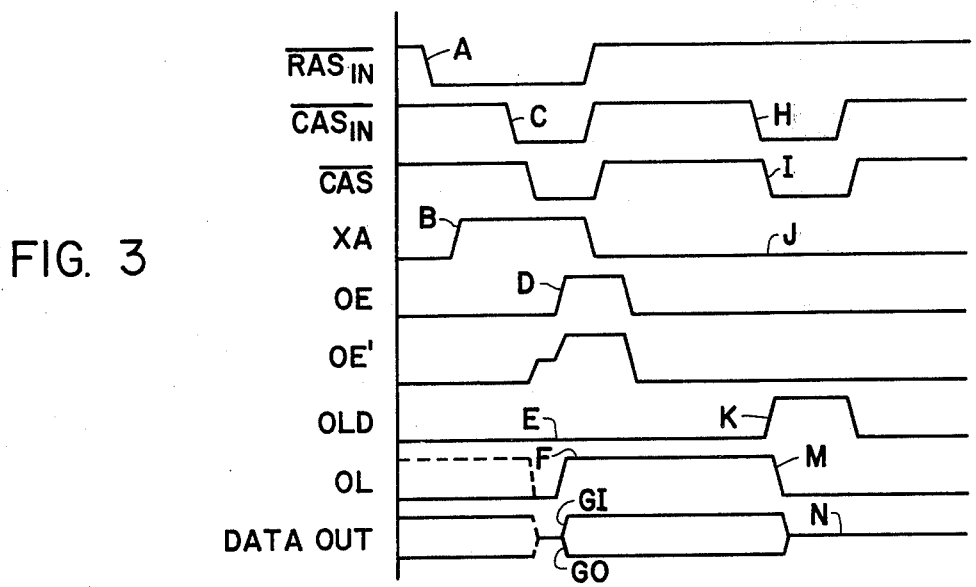
FIG. 3 is a timing diagram useful in describing the operation of the embodiment of FIG. 1 and FIG. 2.

Referring to FIG. 3, the operation of output circuit 10 is described for a typical chip "selected" cycle. First, $\overline{RAS}_{IN}$ undergoes negative transition A to a 0 level. This activates circuitry (not shown) which causes XA to undergo transition B from a logical 0 to a logical 1. This causes MOSFET 19 to turn on. Next, $\overline{CAS}_{IN}$ undergoes transition C to a 0 level. This turns MOSFET 17 off and MOSFET 19 charges node 15 to a logical 1, turning on MOSFETs 40 and 46. MOSFET 30 is also turned off by transition C. Since MOSFET 40 is on, node 28 remains at ground, and MOSFET 42 remains off. Thus, node 44, designated by waveform OLD, remains at ground, where it was previously discharged by MOSFET 48 when $\overline{CAS}_{IN}$ was high. Thus MOSFET 50 remains in the off condition, and waveform OL at node 60, remains unaffected by disable circuit 14.

Output latch 12 is then in a condition so that OL can be charged up by MOSFET 64 when OE goes high, causing latch 12 to establish a stored logical 1 or logical 0 in response to an input applied to node 87, which receives a signal multiplexed from the bit sense line of the selected column of storage array 72. It was assumed during the above operation that MOSFET 36 is on. MOSFET 36 actually goes on whenever OL is at a logical 1. However, since MOSFET 40 was in an on condition, node 28 is held at ground regardless of whether MOSFET 36 is on or not.

In FIG. 3 the data out waveform indicates the result of a selected chip sensing a logical 1 or a logical 0 at transitions G1 or G0, respectively.

However, if the subject RAM chip is not selected, then there is no negative transition of the $\overline{RAS}_{IN}$ input. Instead, the first event that occurs is the negative transition H of $\overline{CAS}_{IN}$ from a logical 1 to a logical 0. XA remains at a logical 0 as indicated by J in FIG. 3. Thus, MOSFET 19 remains off, and node 15 remains at approximately ground after $\overline{CAS}_{IN}$ undergoes transition H.

This causes MOSFETs 40 and 46 to remain in the off condition. OL, at node 60, will still be at a logical 1 level as a result of being charged to that level during the previous selected memory cycle. Consequently, MOSFET 36 will still be on. Therefore, when $\overline{CAS}_{IN}$ undergoes transition H, and MOSFET 30 is turned off, node 28 undergoes a transition from approximately ground to $V_{DD}$ volts. This causes MOSFET 42 to be turned on, and since both MOSFETs 48 and 46 are in the off condition, OLD node 44, rises to $V_{DD}$ volts, turning MOSFET 50 on (see transition K of the OLD waveform of FIG. 3). This causes OL to be discharged during transition M. This in turn disables output latch 12 and simultaneously turns MOSFET 36 off, so that disable circuit 14 dissipates no further power until the occurrence of a selected memory cycle. Output latch 12 is disabled because OL is discharged to ground. Consequently, regardless of the stored state in latch 12, the output nodes 87 and 58' thereof are discharged to ground, turning off both MOSFETs 88 and 90. As a result, data out conductor 86 is effectively electrically open, so that another RAM chip connected to the common data conductor may be selected and may communicate with the common data bus without being interferred with by the subject unselected chip.

What is claimed is :

1. An electronic circuit comprising:
   a bootstrap inverting circuit including a switching MOSFET and a load MOSFET coupled in series, and a bootstrap capacitor charging MOSFET coupled to the gate of said load MOSFET;
   a series MOSFET coupled in series between a first voltage supply conductor and a drain of said load MOSFET;
   feedback circuit means coupled between an output of said bootstrap inverting circuit and a gate of said series MOSFET for controllably turning said series MOSFET off in response to a signal applied to a gate of said switching MOSFET to reduce power dissipation of said bootstrap inverter circuit; and
   said feedback means including inverting means responsive to said signal and having an input coupled to said output of said bootstrap inverting circuit and having an output coupled to said gate of said series MOSFET.

2. In an electronic memory circuit, an output disable circuit for disabling an output latch circuit comprising:
   a bootstrap NOR circuit coupled in series between a first MOSFET and a first supply voltage conductor, said bootstrap NOR circuit also being coupled to a second supply voltage conductor, said bootstrap NOR circuit including a first switching MOSFET having its gate coupled to a first address control input, a second switching MOSFET having its gate coupled to a second address control input, and a bootstrap load circuit coupled between said first MOSFET and said first and second switching MOSFETs;
   a second NOR circuit coupled between said first and second supply voltage conductors and having a gate of a load MOSFET coupled to an output of said bootstrap NOR circuit, and having a third switching MOSFET having its gate coupled to said first address control input and having a fourth switching MOSFET having a gate coupled to said second address control input;
   an output MOSFET having a drain coupled to said output latch circuit and to the gate of said first MOSFET, and having its source connected to said first supply voltage conductor and its gate connected to an output of said second NOR circuit;
   an inverter coupled between said first and second voltage supply conductors and having a second load MOSFET, said second load MOSFET having its gate coupled to circuitry generating a signal, which holds said second load MOSFET in an off condition when said second address control input of said electronic memory circuit is not activated, for selecting said electronic memory circuit, said inverter also including a switching MOSFET having its gate coupled to said first address control input, said inverter having its output coupled to said gate of said second switching MOSFET and to said gate of said fourth switching MOSFET.

3. An output circuit for a random access memory comprising:
   a first address control input;
   a second address control input;
   a first voltage conductor and a second voltage conductor;
   a first conductor;
   a latch circuit coupled between said first conductor and said first voltage conductor;
   first inverting means responsive to said first and second address control inputs and coupled between said first and second voltage conductor;
   coupling means coupled between said first inverting means and said second voltage conductor for electrically coupling or decoupling said first inverting means on said second voltage conductor in response to said first conductor;
   second inverting means responsive to said first and second address control inputs and to said first inverting means for controlling said first conductor, thereby controlling said electrical coupling and decoupling.

* * * * *